United States Patent [19]

Kamiya

[11] 4,240,115
[45] Dec. 16, 1980

[54] CHANNEL SELECTION VOLTAGE GENERATOR

[75] Inventor: Masanori Kamiya, Yokohama, Japan

[73] Assignee: Hitachi, Ltd., Japan

[21] Appl. No.: 968,260

[22] Filed: Dec. 11, 1978

[30] Foreign Application Priority Data

Jul. 26, 1978 [JP] Japan .................................. 53-90476

[51] Int. Cl.³ ........................... H03J 7/26; H04B 1/26
[52] U.S. Cl. ................................ 358/193.1; 331/36 C;
358/195.1; 455/164; 455/169; 455/182;
455/192; 455/262
[58] Field of Search ............... 325/416, 418, 420, 422,
325/423, 453, 464, 468, 470, 469; 358/195, 193,
193.1, 195.1; 331/36 C, 177 V; 334/11, 14–16;
455/164, 169, 182, 192, 195, 257, 258, 261–264

[56] References Cited

U.S. PATENT DOCUMENTS

| | | | |
|---|---|---|---|
| 3,943,449 | 3/1976 | Hendrickson et al. | 325/420 |
| 3,968,441 | 7/1976 | Garskamp | 325/420 |
| 3,980,968 | 9/1976 | Ma | 325/422 |
| 4,009,442 | 2/1977 | von Brömssen | 455/164 |

*Primary Examiner*—Marc E. Bookbinder
*Attorney, Agent, or Firm*—Craig & Antonelli

[57] ABSTRACT

A channel selection voltage generator comprises a tuning voltage generator circuit having a capacitor for supplying a tuning voltage to an electronic tuner, a first constant current source for constantly discharging the capacitor at a first constant current and a second constant current source adapted to be rendered selectively in an operative state and in an inoperative state for selectively charging the capacitor at a second constant current which is higher than the first constant current, a frequency discrimination circuit for producing a discrimination signal representative of the amount of frequency deviation when a tuning voltage deviates from a receiving frequency, a buffer circuit for producing a binary "1" level signal when the discrimination signal is higher than a predetermined value and producing a binary "0" level signal when the discrimination signal is lower than the predetermined value, and a control circuit for causing the second constant current source to assume the inoperative state when the binary signal is at "0" level and causing the second constant current source to assume the operative state when the binary signal is at "0" level, the control circuit serving to maintain the second constant current source in the operative state or the inoperative state irrespective of the level of the binary signal during the frequency sweep.

8 Claims, 9 Drawing Figures

CHANNEL SELECTION VOLTAGE GENERATOR

BACKGROUND OF THE INVENTION

1. Field of the Invention

The present invention relates to a channel selection voltage generator for a radio receiver, a television receiver or the like which is equipped with an automatic frequency control circuit for automatically maintaining a received signal frequency at a constant frequency.

2. Description of the Prior Art

The channel selection voltage generator for a radio receiver, a television receiver or the like which is equipped with an automatic frequency control circuit has been known, for example, by Japanese Pat. Appln. Post-Exam. Publn. No. 22125/68. In such a prior art apparatus, however, since the direction of sweep is limited to one direction, when it is desired to select a channel or a broadcasting station which is close to a channel or a broadcasting station currently being received but lies in a rearward frequency position with respect to the sweep direction, it is necessary to sequentially capture undesired stations and release the capture. Therefore, the channel selection operation is very troublesome.

Furthermore, since the prior art apparatus uses a continuously variable current source to control the received signal frequency, the apparatus is not suitable for digital control, and in particular it is not suitable for the channel selection voltage generator for a television receiver which is equipped with a discriminator for discriminating a picture carrier from a sound carrier to produce a digital discrimination signal.

SUMMARY OF THE INVENTION

It is an object of the present invention to provide a channel selection voltage generator capable of bidirectionally sweeping the frequency.

It is another object of the present invention to provide a channel selection voltage generator capable of automatically and in a digital manner controlling the frequency.

The channel selection voltage generator of the present invention may comprise a capacitor with a charge the voltage across which is supplied to an electronic tuner, a first constant current source for charging or discharging the capacitor with a first constant current, and a second constant current source for discharging or charging the capacitor with a second constant current higher than the first constant current and adapted to be rendered selectively operative or inoperative. When the second constant current source is operative, the capacitor is charged or discharged with a differential current between the first and second constant currents for a frequency sweep, and when the second constant current source is inoperative, the capacitor is charged or discharged with the first constant current and the frequency sweep takes place in the opposite direction to the first frequency sweep. During the frequency sweep, the second constant current source is maintained in an operative or in an inoperative state until a broadcasting signal is captured, and when the broadcasting signal is captured, the operative state and the inoperative state of the second constant current source are repeated such that the charge voltage of the capacitor lies within a predetermined range centered at a capacitor charge voltage corresponding to the received signal frequency.

DESCRIPTION OF THE PREFERRED EMBODIMENTS

Figure 1:
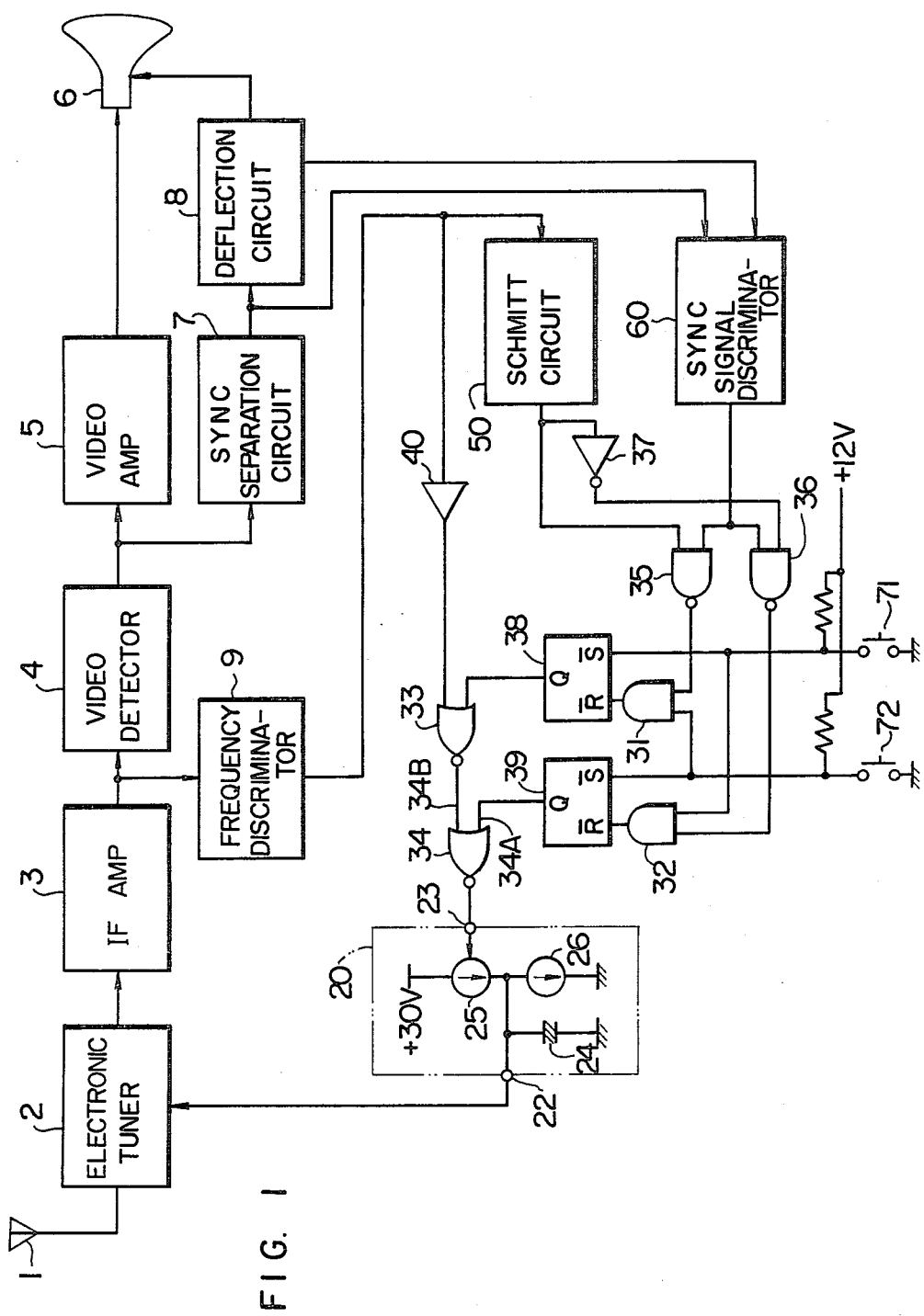
FIG. 1 is a block diagram of one embodiment of a channel selection voltage generator of the present invention.

Referring to FIG. 1, numeral 1 denotes an antenna, 2 an electronic tuner, 3 an intermediate frequency amplifier, 4 a video detector circuit, 5 a video amplifier circuit, 6 a picture tube, 7 a sync separation circuit, 8 a deflection circuit and 9 a frequency discriminator circuit. These constitute a portion of a conventional television receiver. A tuning voltage generator circuit 20 comprises a capacitor 24, a constant current source 25 for charging the capacitor 24 and a constant current source 26 for discharging the capacitor 24. The current of the constant current source 25 may be in the order of 200 $\mu$A and the current of the constant current source 26 may be one half of the current of the constant current source 25, that is, in the order of 100 $\mu$A. Thus, when both the constant current sources 25 and 26 are rendered operative, the capacitor 24 is charged with a differential current of 100 $\mu$A to produce a voltage which increases with time at an output terminal 22. On the other hand, when the constant current source 25 is rendered inoperative while the constant current source 26 is kept operative, the capacitor 24 is discharged with the current of 100 $\mu$A of the constant current source 26 to produce a voltage which decreases with time at the output terminal 22. When the capacitance of the capacitor 24 is equal to 22 $\mu$F, the rate of increase or decrease of the charge voltage is approximately 4.5 V/sec. The charge voltage of the capacitor 24 is supplied to a variable capacitance diode of the tuner 2 as a tuning voltage to determine a receiving frequency. The constant current source 25 is rendered operative when a binary signal applied to a terminal 23 is "1" (e.g. 12 volts) and is rendered inoperative when the binary signal is "0" (e.g. 0 volt).

Figure 2:
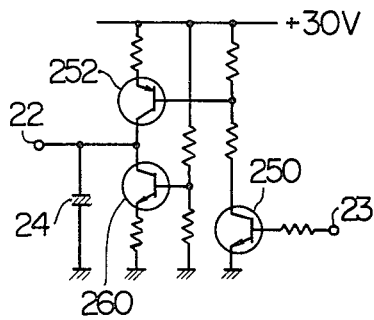
FIG. 2 shows a specific example of the tuning voltage generator circuit shown in FIG. 1.

The tuning voltage generator circuit 20 may be constructed as shown in FIG. 2, in which a transistor 260 constitutes the constant current source 26 which constantly discharges the capacitor 24 with the current of 100 $\mu$A. Transistors 250 and 252 constitute the constant current source 25, and they are both turned on when the "1" level signal is applied to the control terminal 23 to operate as the 200 $\mu$A constant current source. In this case, the capacitor 24 is charged with the differential current of 100 $\mu$A of the two constant current sources. When the "0" level signal is applied to the control terminal 23, the transistors 250 and 252 are both nonconductive.

Input-output conditions for AND circuits 31 and 32, NOR circuits 33 and 34, NAND circuits 35 and 36, an inverter circuit 37 and set-reset type flip-flop circuits 38 and 39 are shown in the truth table set forth below, where "1" corresponds to 12 volts and "0" corresponds to 0 volt.

Truth Table

| A | B | C AND |
|---|---|---|
| 0 | 0 | 0 |
| 0 | 1 | 0 |
| 1 | 0 | 0 |
| 1 | 1 | 1 |

| A | B | C NOR |
|---|---|---|
| 0 | 0 | 1 |
| 0 | 1 | 0 |
| 1 | 0 | 0 |
| 1 | 1 | 0 |

| A | B | C NAND |
|---|---|---|
| 0 | 0 | 1 |
| 0 | 1 | 1 |
| 1 | 0 | 1 |
| 1 | 1 | 0 |

| A | B INV |
|---|---|
| 0 | 1 |
| 1 | 0 |

RS F/F

| R | S | Qn |
|---|---|---|
| 0 | 0 | 1 |
| 0 | 1 | 0 |
| 1 | 0 | 1 |
| 1 | 1 | Qn-1 |

Figure 3:
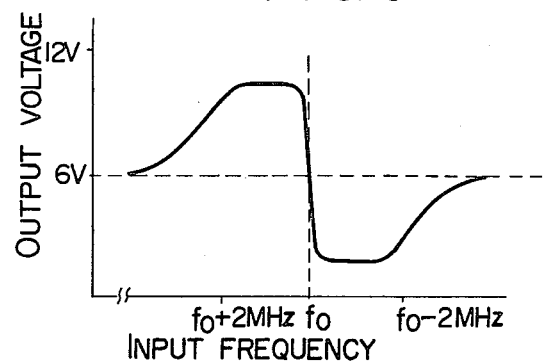
FIG. 3 shows a frequency characteristic curve of the frequency discriminator shown in FIG. 1.

The frequency discriminator circuit 9 has an input-output characteristic as shown in FIG. 3, in which a center frequency $f_o$ corresponds to the frequency of the picture carrier wave in the intermediate frequency amplifier 3 of FIG. 1, and it is equal to 58.75 MHz in a Japanese standard television receiver. The output signal of the frequency discriminator circuit 9 which is produced in accordance with the characteristic shown in FIG. 3 as the frequency is swept is converted to binary signals by a buffer circuit 40 and a Schmitt circuit 50, respectively.

Figure 4:
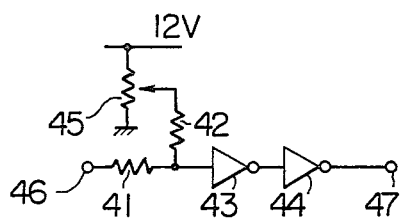
FIG. 4 shows a specific example of the buffer circuit shown in FIG. 1.
Figure 5:
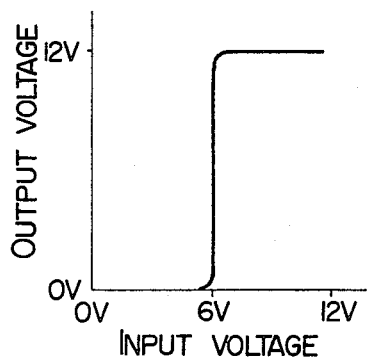
FIG. 5 shows an input-output characteristic of the buffer circuit of FIG. 4.

The buffer circuit 40 may comprise, as shown in FIG. 4, resistors 41 and 42, inverters 43 and 44 and a potentiometer 45, and it has an input-output characteristic between input and output terminals 46 and 47 as shown in FIG. 5. The potentiometer 45 serves to compensate for any variance of a threshold voltage of the inverter circuit 43.

Figure 6:
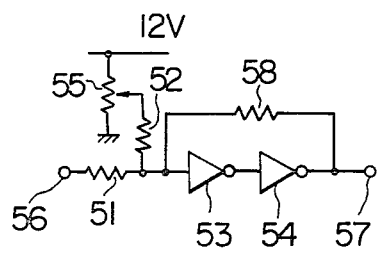
FIG. 6 shows a specific example of a Schmitt circuit shown in FIG. 1.
Figure 7:
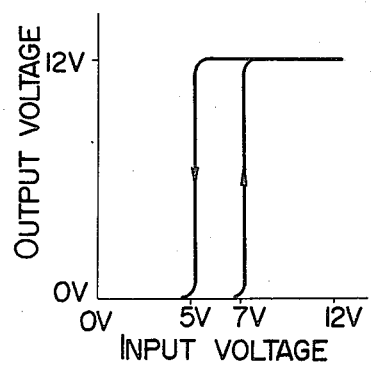
FIG. 7 shows an input-output characteristic of the Schmitt circuit of FIG. 6.

The Schmitt circuit 50 may comprise, as shown in FIG. 6, resistors 51, 52 and 58, inverter circuits 53 and 54 and a potentiometer 55 and it has an input-output characteristic between input and output terminals 56 and 57 as shown in FIG. 7. The potentiometer 55 serves to compensate for any variance of a threshold voltage of the inverter circuit 53.

Figure 8:
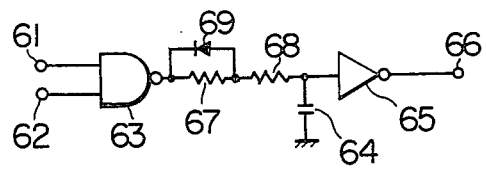
FIG. 8 shows a specific example of a synchronizing signal discrimination circuit shown in FIG. 1.

A synchronizing signal discriminator circuit 60 produces a binary "1" signal only when the phase of the horizontal synchronizing signal derived from the output of the sync separation circuit 7 coincides with the phase of the horizontal flyback pulse derived from the deflection circuit 8, and produces a binary "0" signal when they do not coincide with each other. The synchronizing signal discriminator circuit 60 may be constructed as shown in FIG. 8, in which a power supply voltage is at 12 volts, and the positive polarity horizontal synchronizing signal of approximately 10 volts peak-to-peak is applied to an input terminal 61 from the sync separation circuit 7 while the positive polarity horizontal flyback pulse of approximately 10 volts peak-to-peak is applied to an input terminal 62 from the deflection circuit 8.

When a normal synchronizing signal is not included in a composite video signal derived from the output of the video detector circuit 4, the voltage at the input terminal 61 does not exceed the threshold voltage (approximately 6 volts) of the NAND circuit 63 at the same timing as the voltage at the input terminal 62 does. In this case, therefore, the output voltage of the NAND circuit 63 is equal to 12 volts and the capacitor 64 is charged to 12 volts. Accordingly, the output of the inverter circuit 65, that is, the voltage at the output terminal 66 assumes 0 voltage. When the output of the video detection circuit 4 produces the normal composite video signal and the output of the sync separation circuit 7 includes the horizontal synchronizing signal, the voltages at the input terminals 61 and 62 simultaneously assume approximately 10 volts periodically. Thus, the voltage of the capacitor 64 which has been charged through resistors 67 and 68 during the absence-of-synchronizing signal period is discharged through a resistor 68 and a diode 69 each time a synchronizing signal is applied. When the resistance of the resistor 68 is selected to be sufficiently smaller than the resistance of the resistor 67, the charge voltage of the capacitor 64 when the normal horizontal synchronizing signal is received falls below the threshold voltage (approximately 6 volts) of the inverter circuit 65 so that the output of the inverter circuit 65, that is, the voltage at the output terminal 66 assumes 12 volts. Accordingly, when the output of the video detector circuit 4 includes the normal composite video signal, the synchronizing signal discriminator circuit 60 produces a binary "1" signal, and when the output of the video detector circuit 4 does not produce the normal composite video signal, the synchronizing signal discriminator circuit 60 produces a binary "0" signal.

Since the frequency discriminator circuit 9 produces the output voltage as shown in FIG. 3 as the receiving frequency of the signal carrier changes, it can discriminate whether the signal carrier is being received or not. However, since the television signal includes a picture carrier and a sound carrier and the television receiver is designed to carry out normal reproduction when the tuner 2 is tuned to the picture carrier, it is necessary to discriminate the picture carrier from the sound carrier when the television signal is selected by the sweep of the frequency. When the tuning frequency of the tuner 2 coincides with the sound carrier frequency, no horizontal synchronizing signal is produced at the output of the sync separation circuit 7 and the picture carrier can be discriminated from the sound carrier by the synchronizing signal discriminator circuit 60.

Channel selection starting switches 71 and 72 are normally open and they are closed only when they are manually actuated. When the channel selection starting switches are closed, flip-flop circuits 38 and 39 are set, respectively.

First, assume that a television broadcasting wave is being received and the receiving frequency is stable. In this case, the flip-flop circuits 38 and 39 are both in their reset states and the outputs Q are at "0" level. The output of the buffer circuit 40 is inverted by a NOR circuit 33 and further inverted by another NOR circuit 34. Therefore, the same signal as the output of the buffer circuit 40 is applied to the control terminal 23.

If the output of the NOR circuit 34 is at "1" level at a certain time, the constant current source 25 is rendered operative and the capacitor 24 is charged. As a result, the output voltage of the tuning voltage generator circuit 20 gradually rises so that the tuning frequency of the electronic tuner 2 also gradually rises. The tuning frequency of the electronic tuner 2 is monitored by the frequency discriminator circuit 9. As the input frequency to the frequency discriminator circuit 9 rises above the frequency $f_o$ by a small frequency increment, the output voltage of the frequency discriminator circuit 9 rapidly falls in accordance with the characteristic shown in FIG. 3. When the output voltage of the frequency discriminator circuit 9, that is, the input voltage to the buffer circuit 40 falls below 6 volts, the output of the buffer circuit 40 assumes the "0" level and the constant current source 25 is rendered inoperative so that the capacitor 24 is discharged by the constant current source 26. As a result, the output voltage of the tuning voltage generating circuit 20 gradually falls and the tuning frequency of the electronic tuner 2 also gradually falls. Accordingly, the input frequency of the frequency discriminator circuit 9 approaches the frequency $f_o$ and falls below $f_o$ by a small frequency increment, at which point the output voltage of the frequency discriminator circuit 9 rapidly rises. When the output voltage of the frequency discriminator circuit 9, that is, the input voltage to the buffer circuit 40 exceeds 6 volts, the output voltage of the buffer circuit again assumes the "1" level and the output voltage of the tuning voltage generator circuit 20 gradually rises. Thus, when a television broadcasting wave is being received and the circuit is stable, the tuning frequency is stable while it oscillates around the normal receiving frequency by a small frequency increment. The output voltage of the frequency discriminator circuit 9 increases or decreases by only several millivolts around 6 volts and this change of frequency is too small to be detected on the screen of a television receiver.

The frequency sweep operation when the channel selection starting switches 71 and 72 are closed will now be explained. The output terminals Q of the flip-flop circuits 38 and 39 are at "1" level when they are set and at "0" level when they are reset. The set and reset states of the flip-flop circuits 38 and 39 are maintained unless reset and set signals, respectively, are applied subsequently. When the channel selection starting switch 71 is closed, the $\overline{S}$-terminal of the flip-flop circuit 38 and the $\overline{R}$-terminal of the flip-flop 39 assume "0" level so that the flip-flop circuits 38 and 39 are set (Q="1") and reset (Q="0"), respectively. Under this condition, irrespective of the output state of the buffer circuit 40, the output of the NOR circuit 33 assumes "0" level and the output of the NOR circuit 34 assumes "1" level so that the constant current source 25 is rendered operative. Consequently, the output voltage of the tuning voltage generating circuit 20 gradually rises. In order to render the constant current source 25 inoperative, it is necessary to switch at least one input of the NOR circuit 34 to "1" level. When the channel selection starting switch 72 is closed to set the flip-flop circuit 39, the first input terminal 34A of the NOR circuit 34 becomes to be at "1" level. Otherwise, when the output of the NAND circuit 35 assumes "0" level to reset the flip-flop circuit 38 and the output of the buffer circuit 40 produces a "0" level signal, the second input terminal 34B of the NOR circuit 34 becomes to be at "1" level. Accordingly, when one of these cases occurs, the operation of the tuning voltage generator circuit 20 is switched from rising mode to falling mode.

When the channel selection starting switch 72 is closed, the flip-flop circuit 39 is set and the "1" level signal is applied to the first input terminal 34A of the NOR circuit 34. Therefore, irrespective of the input state at the second input terminal 34B and hence irrespective of the output state of the buffer circuit 40, the output of the NOR circuit 34 assumes "0" level and the constant current source 25 is rendered inoperative. Consequently, the charge voltage of the capacitor 24 gradually falls. Since the flip-flop circuit 38 is reset by the closure of the channel selection starting switch 72, the output of the NAND circuit 36 produces the "0" level signal in the course of fall of the tuning voltage. At this time, the flip-flop circuit 39 is reset and the output of the buffer circuit 40 assumes "1" level so that the constant current source 25 is switched from inoperative state to operative state.

Thus, the input state at the control terminal 23 is at "1" level when the channel selection starting switch 71 is closed and the flip-flop circuits 38 and 39 are set and reset, respectively, it is at "0" level when the channel selection starting switch 72 is closed and the flip-flop circuits 38 and 39 are reset and set, respectively, and it assumes the output state of the buffer circuit 40 when the flip-flop circuits 38 and 39 are both reset.

Now, consider a channel A and a channel B and the channel B lies at a higher frequency than the channel A. When the receiving channel is to be changed from the channel A to the channel B, the output of the NAND circuit 35 is maintained at "1" level to keep the flip-flop circuit 38 set until the charge voltage of the capacitor 24 changes from the tuning voltage for the channel A and approaches the tuning voltage for the channel B, when the output of the NAND circuit 35 is switched to "0" level to reset the flip-flop circuit 38 so that the charge voltage of the capacitor 24 is controlled by the output state of the buffer circuit 40. With this arrangement, the pull-in of the tuning frequency of the tuner 2 to an undesired signal frequency such as the sound carrier of the television signal during the frequency sweep can be prevented. Similarly, when the receiving channel is to be changed from the channel B to the channel A, the output of the NAND circuit 36 is maintained at "1" level in the course of a fall of the charge voltage of the capacitor 24 and the flip-flop circuit 39 is kept set.

Figure 9:
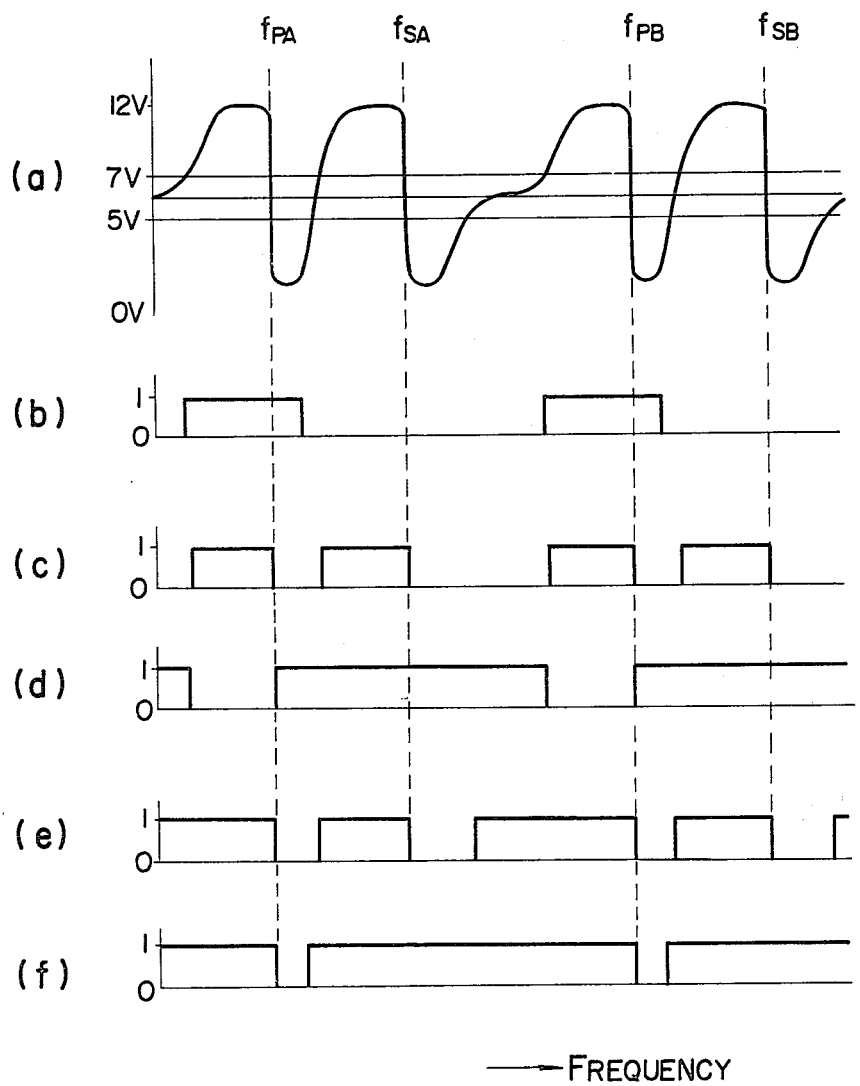
FIG. 9 shows waveforms at major points in FIG. 1.

FIG. 9 shows voltage waveforms at major points in FIG. 1, where the abscissa represents the receiving frequency, $f_{PA}$ and $f_{SA}$ represent the picture carrier frequency and the sound carrier frequency, respectively, of the channel A, and $f_{PB}$ and $f_{SB}$ represent the picture carrier frequency and the sound carrier frequency, respectively, of the channel B. As the frequency is swept, the output of the frequency discriminator circuit 9 produces a voltage shown in FIG. 9(a) and the output of the synchronizing signal discriminator circuit 60 produces a voltage shown in FIG. 9(b). The horizontal synchronizing usually appears only in the vicinity of the normal tuning frequency, that is, the frequency $f_{PA}$ or $f_{PB}$, and when the sound carrier approaches the tuning frequency, the level of the sound carrier signal becomes higher than the level of the picture carrier signal so that the signal waveform detected by the video detector circuit 4 does not include the composite video signal and the output of the sync separation circuit 7 does not produce the normal horizontal synchronizing signal. Accordingly, the output assumes "1" level only in the vicinity of the frequencies $f_{PA}$ and $f_{PB}$, as shown in FIG. 9(b). FIG. 9(c) shows an output voltage of the Schmitt circuit 50 when the receiving frequency rises. It assumes "1" level when the output of the frequency discriminator circuit 9 produces a voltage of 7 volts or higher. FIG. 9(d) shows an inversion of a logical AND of the binary signals shown in FIG. 9,(b) and (c) and it shows an output state of the NAND circuit 35 when the receiving frequency rises. FIG. 9(e) shows an output voltage of the Schmitt circuit 50 when the receiving frequency falls. It assumes "1" level when the output of the frequency discriminator circuit 9 produces a voltage of 5 volts or higher. FIG. 9(f) shows an inversion of a logical AND of the output of the inverter 37 to which the binary signal shown in FIG. 9(e) is applied and the binary signal shown in FIG. 9(b), and it shows an output state of the NAND circuit 36 when the receiving frequency falls.

When the channel A is being selected, the capacitor 24 is charged to a voltage $V_{PA}$ which corresponds to the receiving frequency $f_{PA}$. The output of the frequency discriminator circuit 9 produces a voltage which varies around 6 volts within the amount of several millivolts. When the channel selection starting switch 71 is closed to set and reset the flip-flop circuits 38 and 39, respectively, the capacitor 24 is charged as described above and the charge voltage rises above $V_{PA}$ and the receiving frequency also rises. Since the output of the frequency discriminator 9 falls below 5 volts in response to a slight rise of the receiving frequency, the output of the Schmitt circuit 50 assumes "0" level so that the flip-flop circuit 38 is kept set even after the channel selection starting switch 71 is opened. Thus, the receiving frequency continues to rise. As the receiving frequency rises, the audio signal of the channel A is received and the output of the frequency discriminator circuit 9 rises above 7 volts to change the output of the Schmitt circuit 50 to "1" level. However, since no horizontal synchronizing signal is present, the flip-flop circuit 38 is not reset but kept set so that the receiving frequency continues to rise. Only when the sound carrier of the channel B has been received, two "1" level signals are applied to the NAND circuit 35 and the flip-flop circuit 38 is reset so that the receiving frequency is controlled by the output of the buffer circuit 40 and the receiving frequency is stabilized to $f_{PB}$. Once the receiving frequency is stabilized, the output voltage of the frequency discriminator circuit 9 does not fall below 5 volts. Therefore, the output level of the Schmitt circuit 50 remains at "1" level and the flip-flop circuits 38 and 39 are kept reset.

When the channel B is being selected, and the channel selection starting switch 72 is closed and the receiving frequency starts to fall, the receiving frequency continues to fall until the picture carrier is again received, when the receiving frequency is stabilized at that picture carrier frequency.

I claim:

1. A channel selection voltage generator for an electronic tuner having a receiving frequency and a tuning frequency, comprising:

a frequency discriminator connectable to said electronic tuner for producing a discrimination signal, said discrimination signal having a magnitude which is at a center value when said tuning frequency and said receiving frequency are in a predetermined relationship and changes between an upper limit and a lower limit in accordance with a frequency deviation from said relationship as said tuning frequency deviates from said receiving frequency;

a sweep voltage generator including a capacitor for producing a control voltage to be supplied to said tuner for control of said tuning frequency, a first constant current source for supplying a first constant current to said capacitor to perform with respect to said capacitor one operation selected from (a) charging said capacitor and (b) discharging said capacitor, to change the voltage across said capacitor in one of (c) increasing voltage direction and (d) decreasing voltage direction, and a second constant current source for supplying a second constant current higher than said first constant current to said capacitor to change the voltage across said capacitor in the other direction selected from (c) and (d); and a control means connected between said second constant current source and said frequency discriminator for maintaining said second constant current source in one state selected from (e) an operative state and (f) an inoperative state so that said discrimination signal decreases when said discrimination signal is higher than said center value of said discrimination signal and maintaining said second constant current source in the other state selected from (e) and (f) so that said discrimination signal increases when said discrimination signal is lower than said center value, and wherein said control means includes a holding means for maintaining said second constant current source in any one of (e) said operative state and (f) said inoperative state to change the voltage across said capacitor irrespective of said discrimination signal from said frequency discriminator, and a release means for releasing said holding means to cause said second constant current source to assume one of (e) said operative state and (f) said inoperative state in response to said discrimination signal when said discrimination signal reaches one of said upper limit and said lower limit as the voltage across said capacitor changes.

2. A channel selection voltage generator for an electronic tuner having a receiving frequency and a tuning frequency, comprising:

a frequency discriminator connectable to said electronic tuner for producing a discrimination signal, said discrimination signal having a magnitude which is at a center value when said tuning frequency and said receiving frequency are in a predetermined relationship and changes between an upper limit and a lower limit in accordance with a frequency deviation from said relationship as said tuning frequency deviates from said receiving frequency;

a sweep voltage generator including a capacitor for producing a control voltage to be supplied to said tuner for control of said tuning frequency, a first constant current source for supplying a first constant current to said capacitor, to perform with respect to said capacitor one operation selected from (a) charging said capacitor and (b) discharging said capacitor, to change the voltage across said capacitor in one of (c) increasing voltage direction and (d) decreasing voltage direction, and a second constant current source for supplying a second constant current higher than said first constant current to said capacitor to change the voltage across said capacitor in the other direction selected from (c) and (d); and a control means connected between said second constant current source and said frequency discriminator for maintaining said second constant current source in one state selected from (e) an operative state and (f) an inoperative state so that said discrimination signal decreases when said discrimination signal is higher than said center value of said discrimination signal and maintaining said second constant current source in the other state selected from (e) and (f) so that said discrimination signal increases when said discrimination signal is lower than said center value, and wherein said control means includes a binary means for producing a first binary level signal when said discrimination signal is higher than said center value and producing a second binary level signal when said discrimination signal is not higher than said center value, said second constant current source being caused to assume one of (e) said operative state and (f) said inoperative state when said binary signal from said control means is at said first binary level and assume the other state selected from (e) and (f) when said binary signal is at said second binary level, wherein said control means further includes a selecting means connected between said binary means and said second constant current source, a first setting means connected to said selecting means for causing said selecting means to produce a binary level signal irrespective of said binary level signal from said binary means and supplying said produced binary level signal to said second constant current source, and a second setting means connected between said selecting means and said frequency discriminator for causing said selecting means to supply one of said first or second binary level signals from said binary means to said second constant current source when said discrimination signal from said frequency discriminator reaches one of said upper limit and said lower limit.

3. For use in a system which receives a broadcasting signal, a channel selection voltage generator comprising
(a) a voltage controlled local oscillator for producing a local oscillating signal whose frequency is responsive to an input voltage;
(b) a tuning voltage generator having a capacitor for producing said input voltage across said capacitor, said capacitor being capable of the operations of (a) charge and (b) discharge, first current supply means for supplying a first constant current to perform one of the operations (a) and (b) with respect to said capacitor, and second current supply means for supplying a second constant current to perform the other of the operations (a) and (b) with respect to said capacitor;
(c) a mixer for mixing said local oscillating signal with said received broadcasting signal to produce an IF signal;
(d) a discriminator supplied with said IF signal for developing a detection voltage whose voltage changes as a function of the frequency difference between a frequency of said IF signal and a reference frequency;
(e) first control means supplied with said detection voltage for causing said first and second current supply means to be in operative and inoperative states, respectively, when said detection voltage is greater than a predetermined value and for causing said first and second current supply means to be in inoperative and operative states, respectively, when said detection voltage is smaller than said predetermined value;
(f) a detector supplied with said IF signal for producing a detection signal when said broadcasting signal is received; and
(g) second control means comprising manual switching means, for operatively causing one of said first and second current supply means to be operative and the other of said first and second current supply means to be inoperative when said manual switching means is manually operated and the operative state of said second control means being maintained until said detection signal is supplied thereto after the manual operation has been released.

4. A channel selection voltage generator according to claim 3, wherein said first control means comprises a first NOR gate having an output terminal connected to said tuning voltage generator, a first input terminal connected to said second control means and a second input terminal, and second NOR gate comprising an output terminal connected to said second input terminal, a first input terminal connected to said second control means and a second input terminal connected to said discriminator, and wherein said first and second current supply means are operative and inoperative when an output level of said first NOR gate is a first binary level and said first and second current supply means are inoperative and operative when said output level is a second binary level.

5. A channel selection voltage generator according to claim 4, wherein said second control means includes binary signal generating means connected to said manual switching means and said detector and comprising first and second output terminals connected to said first input terminals of said first and second NOR gates, respectively, for producing said first binary level at one of said first and second output terminals thereof and said second binary level at the other of said first and second output terminals thereof when manual switching means is manually operated and after said manual operation is released until said detection signal is supplied thereto and for producing said binary level at said first and second output terminals thereof after said detection signal is received until another manual operation intervenes.

6. In an electronic tuning system receiving a broadcasting signal comprising
(a) a voltage controlled local oscillator supplied with a control input voltage for producing a voltage controlled local oscillating signal, the frequency of which is responsive to an amount of the control input voltage,
(b) a mixer for mixing the local oscillating signal with a broadcasting signal received in said tuning system to produce an IF signal, (c) a discriminator for developing a detection voltage as a function of the frequency difference between the IF signal and a reference frequency, and (d) a voltage generator for generating the control input voltage for said local oscillator including (i) a capacitor for producing thereacross the control input voltage to be supplied to said local oscillator, said capacitor being capable of being (a) charged and (b) discharged, (ii) a first constant current source for supplying a first constant current to perform one of the operations (a) and (b) with respect to said capacitor, (iii) a second constant current source for supplying a second constant current to perform the other operation of (a) and (b) with respect to said capacitor in a direction opposite to that of said first current source, and (iv) first control means for controlling said first and second current sources so that a current is supplied to said capacitor to perform either of said (a) and (b) operations dependent upon whether the detection voltage is in either one of two respective conditions, above and below a predetermined value representative of said reference frequency, the improvement comprising:

detecting means for producing a detection signal representative of receipt of said broadcasting signal in said tuning system; and second control means comprising manually controlled switch means for controlling said first and second current sources so that a current is supplied to said capacitor to perform either of said (a) and (b) operations in response to operation of either one of said switches until said detection signal is supplied thereto, said manually controlled switch means operatively initiating the control of said first and second current sources by said second control means and thereafter being rendered ineffective for switching.

7. A control circuit for controlling a tuning voltage generator used in an electronic tuning system which may receive a broadcasting signal including a voltage controlled local oscillator, a mixer for mixing local oscillating signal from said oscillator with said broadcasting signal received in said tuning system to produce an IF signal, a discriminator for developing a detection voltage as a function of the frequency difference between a frequency of said IF signal and a reference frequency, said tuning voltage generator including a capacitor, said capacitor being capable of being (a) charged and (b) discharged, a first constant current source for supplying a first constant current to perform one of the operations (a) and (b) with respect to said capacitor, and a second constant current source for supplying a second constant current to said capacitor to perform the other operation of (a) and (b) with respect to said capacitor, thereby producing a control voltage for the local oscillator across said capacitor, said control circuit comprising:

first control means for controlling said operation with respect to said capacitor;

second control means for controlling said first control means so that the operation of said capacitor is alternated between said one and the other operation dependent upon whether the detection voltage is above or below a predetermined value representative of the reference frequency;

third control means for controlling said first control means so that a current is supplied to said capacitor in either one of said (a) and (b) operations until the control operation of said third control means is reset;

manual switch means for causing said third control means to establish either one of said (a) and (b) operations;

a detector for detecting receipt of said broadcasting signal in the tuning system to produce a detection signal; and fourth control means for resetting said third control means into a reset state in response to the detection signal.

8. The improvement in an electronic tuning system according to claim 6, wherein the broadcasting signal which may be received by said electronic tuning system is a television broadcasting signal, and said detecting means includes a Schmitt circuit supplied with the detection voltage, a sync signal discriminator for discriminating a sync signal, and circuit means for determining from the outputs of said Schmitt circuit and the sync signal discriminator whether said television broadcasting signal is received or not, the detection result by said circuit means being used to control the second control means, whereby the electronic tuning system is tuned to the television broadcasting signal.

* * * * *